(12) United States Patent
Ho et al.

(10) Patent No.: US 11,894,856 B2
(45) Date of Patent: Feb. 6, 2024

(54) DIGITAL-TO-ANALOG CONVERSION APPARATUS AND METHOD HAVING SIGNAL CALIBRATION MECHANISM

(71) Applicant: REALTEK SEMICONDUCTOR CORPORATION, Hsinchu (TW)

(72) Inventors: Hsuan-Ting Ho, Hsinchu (TW); Liang-Wei Huang, Hsinchu (TW); Yun-Chih Tsai, Hsinchu (TW); Chia-Lin Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 149 days.

(21) Appl. No.: 17/728,178

(22) Filed: Apr. 25, 2022

(65) Prior Publication Data

US 2022/0345141 A1    Oct. 27, 2022

(30) Foreign Application Priority Data

Apr. 27, 2021    (TW) .................................. 110115065

(51) Int. Cl.
*H03M 1/10*    (2006.01)
(52) U.S. Cl.
CPC ....... *H03M 1/1023* (2013.01); *H03M 1/1047* (2013.01); *H03M 1/1042* (2013.01)
(58) Field of Classification Search
CPC ............. H03M 1/1023; H03M 1/1047; H03M 1/1042; H03M 1/1038
USPC .................................................. 341/120, 118
See application file for complete search history.

(56) References Cited

U.S. PATENT DOCUMENTS 5,764,694 A    6/1998  Rahamim
7,013,226 B2 *  3/2006  Han ................... G01M 11/3145
                                            702/191

OTHER PUBLICATIONS

1) OA letter of a counterpart TW application (appl. No. 110115065) mailed on Dec. 2, 2021. 2) Summary of the OA letter: 1. Claims 1~10 are rejected as being unpatentable over the disclosure of the cited reference 1 (U.S. Pat. No. 5,764,694). Correspondence bewteen claims of TW counterpart application and claims of US application: 1. Claims 1~10 in TW counterpart application correspond to claims 1~10 in US application, respectively.

* cited by examiner

*Primary Examiner* — Peguy Jean Pierre
(74) *Attorney, Agent, or Firm* — WPAT, P.C

(57) ABSTRACT

The present invention discloses a DAC method having signal calibration mechanism is provided. Operation states of current sources are controlled to generate an output analog signal by a DAC circuit according to a codeword of an input digital signal. An echo signal is generated by an echo transmission circuit according to the output analog signal. The codeword is mapped to generate an offset signal by a calibration circuit according to a codeword offset mapping table. The offset signal is processed to generate an echo-canceling signal by an echo-canceling circuit. By a calibration parameter calculation circuit, offset amounts are generated according to a difference between the echo signal and the echo-canceling signal, the offset amounts are grouped to perform statistic operation according to the operation states and current offset values are calculated according to calculation among groups and converted to codeword offset values to update the codeword offset mapping table.

14 Claims, 2 Drawing Sheets

DIGITAL-TO-ANALOG CONVERSION APPARATUS AND METHOD HAVING SIGNAL CALIBRATION MECHANISM

BACKGROUND OF THE INVENTION

1. Field of the Invention

The present invention relates to a digital-to-analog conversion apparatus and a digital-to-analog conversion method having signal calibration mechanism.

2. Description of Related Art

A DAC circuit is an important circuit component that converts a signal from a digital form to an analog form. Based on different digital codes, the DAC circuit can multiply the digital codes by a corresponding conversion gain value to generate analog signals with different intensities.

However, for a current-output type of DAC circuit, a manufacturing process offset results in non-ideal offsets of amplitude and shape of the outputted analog signal. The offset of amplitude especially affects the system performance seriously.

SUMMARY OF THE INVENTION

In consideration of the problem of the prior art, an object of the present invention is to supply a digital-to-analog conversion apparatus and a digital-to-analog conversion method having signal calibration mechanism.

The present invention discloses a digital-to-analog conversion (DAC) apparatus having signal calibration mechanism that includes a DAC circuit, an echo transmission circuit, a calibration circuit, an echo-canceling circuit, an error calculating circuit, an inverted error calculating circuit and an offset updating circuit. The DAC circuit receives an input digital signal having an input digital codeword from a signal source to perform digital-to-analog conversion to generate an output analog signal. The echo transmission circuit processes the output analog signal to generate an echo signal. The calibration circuit receives the input digital signal and performs mapping from a codeword offset mapping table according to the input digital codeword to generate an offset signal, wherein the codeword offset mapping table comprises a plurality of correspondence relations each corresponds to a codeword and a codeword offset. The echo-canceling circuit processes the offset according to a group of echo-canceling coefficients to generate an echo-canceling signal. The error calculating circuit performs subtraction between the echo signal and the echo-canceling signal to generate an error signal. The inverted error calculating circuit performs one-dimensional inversion on the echo-canceling coefficients and further performs calculation on the inverted echo-canceling coefficients and the error signal to generate an inverted error value. The offset updating circuit updates the codeword offset of one of the correspondence relation in the codeword offset mapping table according to the inverted error value based on a path delay of the echo-canceling circuit and the inverted error calculating circuit.

The present invention also discloses a digital-to-analog conversion method having signal calibration mechanism that includes the steps outlined below. An input digital signal having an input digital codeword is received from a signal source by a DAC circuit to perform digital-to-analog conversion to generate an output analog signal. The output analog signal is processed by an echo transmission circuit to generate an echo signal. The input digital signal is received and mapping from a codeword offset mapping table is performed according to the input digital codeword by a calibration circuit to generate an offset signal, wherein the codeword offset mapping table comprises a plurality of correspondence relations each corresponds to a codeword and a codeword offset. The offset is processed according to a group of echo-canceling coefficients by an echo-canceling circuit to generate an echo-canceling signal. Subtraction between the echo signal and the echo-canceling signal is performed by an error calculating circuit to generate an error signal. One-dimensional inversion is performed on the echo-canceling coefficients and calculation is further performed on the inverted echo-canceling coefficients and the error signal by an inverted error calculating circuit to generate an inverted error value. The codeword offset of one of the correspondence relation in the codeword offset mapping table is updated according to the inverted error value based on a path delay of the echo-canceling circuit and the inverted error calculating circuit by an offset updating circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a digital-to-analog conversion apparatus and a digital-to-analog conversion method having signal calibration mechanism to perform calibration on the offset of each of different codewords to avoid the error caused by the offset of the output signal due to the offset of the codewords.

Figure 1:
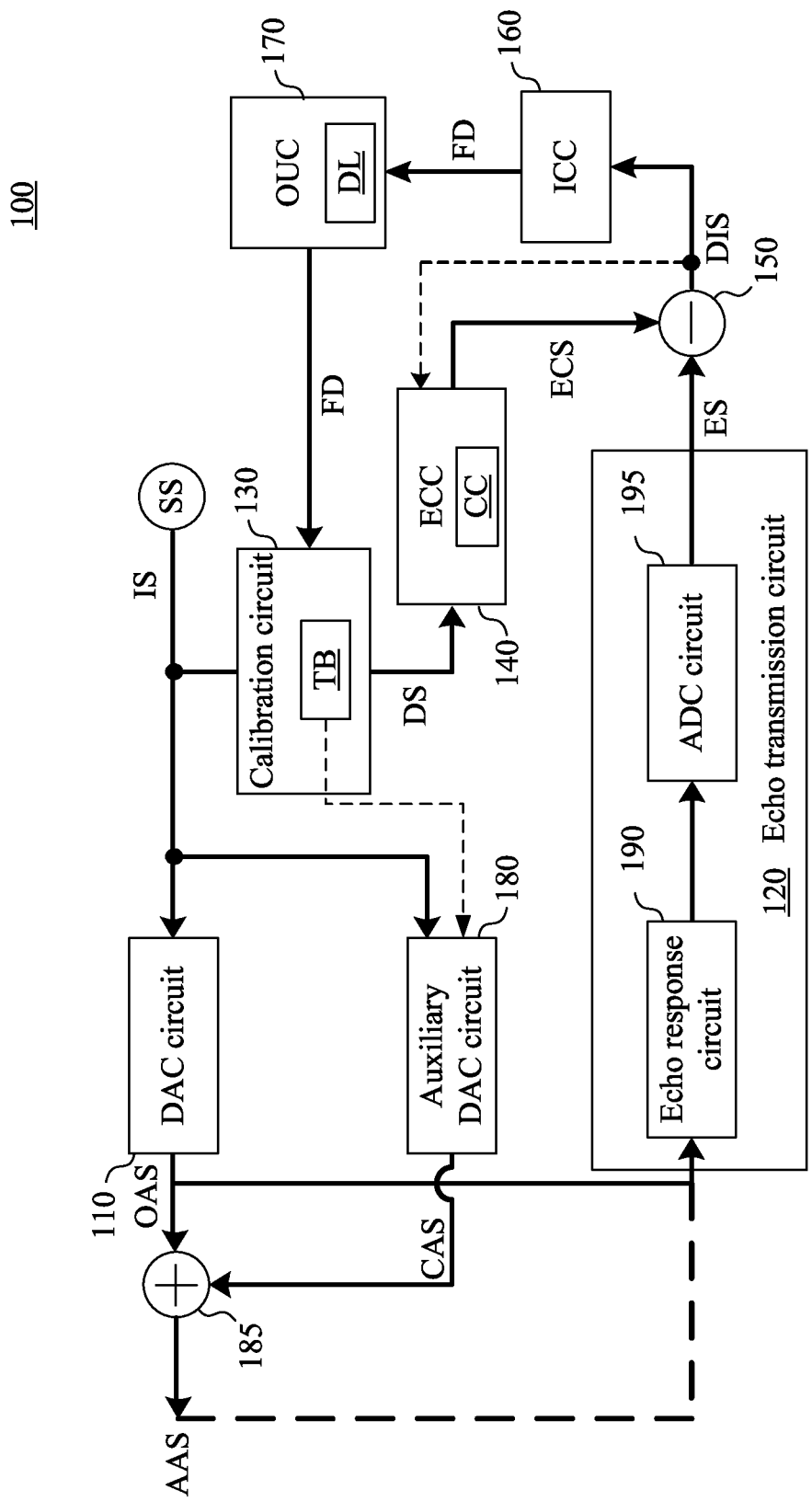
FIG. 1 illustrates a block diagram of a digital-to-analog conversion apparatus having signal calibration mechanism according to an embodiment of the present invention.

Reference is now made to FIG. 1. FIG. 1 illustrates a block diagram of a digital-to-analog conversion apparatus 100 having signal calibration mechanism according to an embodiment of the present invention. The digital-to-analog conversion apparatus 100 includes a DAC circuit 110, an echo transmission circuit 120, a calibration circuit 130, an echo-canceling circuit 140 (abbreviated as ECC in FIG. 1), an error calculating circuit 150, an inverted error calculating circuit 160 (abbreviated as ICC in FIG. 1), an offset updating circuit 170 (abbreviated as OUC in FIG. 1) and an auxiliary DAC circuit 180.

The DAC circuit 110 receives an input digital signal IS including an input digital codeword from a signal source SS. In an embodiment, the signal source SS is such as, but not limited to a transmission circuit (TX) of a communication system. In an embodiment, the digital-to-analog conversion apparatus 100 may dispose a filter (not illustrated in the figure) between the signal source SS and the DAC circuit 110 to filter the input digital signal IS first to generate the input digital signal IS in a form of such as, but not limited to a square wave so as to be transmitted to the DAC circuit 110.

In an embodiment, the input digital codeword of the input digital signal IS can be in the form of such as, but not limited to 12 bits to cover a range of 4096 steps ($2^{12}$) from −2048 to 2047. The DAC circuit 110 multiplies the input digital codeword of the input digital signal IS by a corresponding conversion gain value to perform digital-to-analog conversion to generate an output analog signal OAS. However, due to the manufacturing process offset, different offsets corresponding to different input digital codewords are generated when the DAC circuit 110 performs digital-to-analog conversion.

The offsets that the different input digital codewords correspond to can be quantified as codeword offsets. For example, when the input digital codeword is 2046 and the corresponding conversion gain value is GA, the output analog signal OAS is supposed to be 2046×GA. However, under the influence of the codeword offset of DV, the output analog signal OAS actually becomes (2046+DV)×GA.

The echo transmission circuit 120 processes the output analog signal OAS to generate an echo signal ES. In an embodiment, the echo transmission circuit 120 includes an echo response circuit 190 and analog-to-digital conversion (ADC) circuit 195. The echo response circuit 190 performs an echo response processing on the output analog signal OAS and the analog-to-digital conversion circuit 195 performs analog-to-digital conversion subsequently to generate the echo signal ES. In an embodiment, the echo transmission circuit 120 may selectively include such as, but not limited to a low-pass filter or other digital signal processing circuit (not illustrated in the figure) to perform further digital processing on the echo signal ES.

The calibration circuit 130 receives the input digital signal IS and performs mapping from a codeword offset mapping table TB according to the input digital codeword of the input digital signal IS to generate an offset signal DS.

In an embodiment, the codeword offset mapping table TB can be stored in a storage circuit (not illustrated in the figure) further included in the digital-to-analog conversion apparatus 100. The codeword offset mapping table TB includes a plurality of correspondence relations each corresponds to a codeword and a codeword offset. Take the 12-bit form of codeword as an example, the codeword offset mapping table TB includes 4096 correspondence relations to correspond the codeword from −2048 to 2047 to 4096 codeword offsets. In an embodiment, in an initial state, each of all the offsets that the codewords correspond to is preset to be 0.

The echo-canceling circuit 140 processes the offset DS according to a group of echo-canceling coefficients CC to generate an echo-canceling signal ECS. It is appreciated that in an embodiment, the echo-canceling circuit 140 can be shared with the receiving circuit (RX) of the communication system to cancel the echo signal fed to the receiving circuit from the transmission circuit.

The error calculating circuit 150 performs subtraction between the echo signal ES and the echo-canceling signal ECS to generate an error signal DIS.

In an initial state, the echo-canceling circuit 140 performs training process on the echo-canceling coefficients CC according to the error signal DIS such that the echo-canceling coefficients CC converge. In an embodiment, the training process is a least mean square training process.

After the training process of the echo-canceling coefficients CC is finished, a response processing is applied on the offset DS according to the converged echo-canceling coefficients CC. Such a response processing is identical to the response of a path including the DAC circuit 110 and the echo response circuit 190 that transmits the input digital signal IS from the signal source SS.

Subsequently, the inverted error calculating circuit 160 performs one-dimensional inversion on the echo-canceling coefficients CC and respectively performs calculation on the inverted echo-canceling coefficients CC and the error signal DIS to generate an inverted error value FD.

In an embodiment, the inverted error calculating circuit 160 only selects the coefficients having the most of the energy accumulated thereon to perform one-dimensional inversion. For example, the echo-canceling coefficients CC may include 256 coefficients. The inverted error calculating circuit 160 only selects 32 coefficients thereof having the most of the energy accumulated thereon to perform one-dimensional inversion. In an embodiment, since most of the signal bouncing is at the near end, the coefficients having the most of the energy accumulated thereon are the first 32 coefficients of the 256 coefficients.

It is appreciated that the embodiment described above is merely an example. In other embodiments, the number of the echo-canceling coefficients CC and the number of the echo-canceling coefficients selected to perform one-dimensional inversion can be different depending on practical requirements.

Take 32 coefficients as an example, after the one-dimensional inversion is performed, the 1st and the 32nd coefficients are exchanged, and the 2nd and the 31st coefficients are exchanged, so on and so forth. The inverted error calculating circuit 160 further multiplies the value of the error signal DIS by each of these coefficients and accumulates the multiplied results to generate the inverted error value PD.

In an embodiment, the inverted error calculating circuit 160 can simplify the echo-canceling coefficients CC supposed to have one-dimensional inversion performed thereon.

More specifically, in an embodiment, the inverted error calculating circuit 160 simplifies the echo-canceling coefficients CC according to a maximum energy distribution by selecting one or two coefficients corresponding to the largest energy from the echo-canceling coefficients CC and forcing other coefficients to become zero. As a result, the echo-canceling coefficients CC supposed to have one-dimensional inversion performed thereon only include two or less than two non-zero coefficients such that the calculation of the inverted error calculating circuit 160 can be simplified.

In another embodiment, when the digital-to-analog conversion apparatus 100 is configured to perform a foreground calibration, the inverted error calculating circuit 160 is further configured to control a sampling phase of the analog-to-digital conversion circuit 195 to perform simplification on the echo-canceling coefficients CC such that the echo-canceling coefficients CC only include one non-zero coefficient while other coefficients are zero. The calculation of the inverted error calculating circuit 160 can therefore be simplified.

For example, since the digital coefficients is equivalent to a down-sampling of the analog coefficients, different digital coefficients can be selected when the sampling phase of the analog-to-digital conversion circuit 195 is modified. If the echo-canceling coefficients CC is close to a form that has only one sampling result (i.e., the other coefficients are all much smaller than one of the coefficient) due to the selection of the sampling phase, such a form is equivalent to having only one non-zero coefficient and can be used to simplify the calculation process of the inversion operation.

It is appreciated that the embodiment described above is merely an example. In other embodiments, other methods can be used to simplify the echo-canceling coefficients CC.

Further, the offset updating circuit 170 updates the codeword offset of one of the correspondence relation in the codeword offset mapping table TB according to the inverted error value FD based on a path delay DL of the echo-canceling circuit 140 and the inverted error calculating circuit 160. In an embodiment, the path delay DL is known information.

For example, when the echo-canceling coefficients CC is 0010 and an inversion thereof is 0100. Under such a condition, the path delay DL is 3 periods (3T). As a result, the offset updating circuit 170 updates the codeword offset in the codeword offset mapping table TB corresponding to the input digital codeword 3 periods before according to the path delay DL.

The updating process of the codeword offset mapping table TB described above is performed along with the feeding of the input digital signal IS having various kinds of codewords by the signal source SS to update the codeword offset of all the possible codewords.

After the codeword offsets are updated to a stable condition, the auxiliary DAC circuit 180 receives the input digital signal IS and performs mapping from the codeword offset mapping table TB according to the input digital codeword to generate an offset calibration analog signal CAS. The absolute value of the offset calibration analog signal CAS is equivalent to the absolute value of the offset that the input digital codeword corresponds to. The digital-to-analog conversion apparatus 100 may further includes an adding circuit 185 to add the offset calibration analog signal CAS and the output analog signal OAS to cancel the offset that the input digital codeword corresponds to and generate an actual output analog signal AAS.

It is appreciated that the codeword offset may be a positive value or a negative value. When the codeword offset is a positive value, the offset calibration analog signal CAS is a negative value. When the codeword offset is a negative value, the offset calibration analog signal CAS is a positive value.

In an embodiment, since the manufacturing offset may also be presented in the auxiliary DAC circuit 180, the echo transmission circuit 120 can be configured to process the actual output analog signal AAS to generate the echo signal ES such that the offset updating circuit 170 updates the codeword offset of one of the correspondence relation in the codeword offset mapping table TB. The signal output of the actual output analog signal AAS can be more accurate.

As a result, the digital-to-analog conversion apparatus of the present invention performs calibration on the offset of each of different codewords to avoid the error caused by the offset of the output signal due to the offset of the codewords. Further, since the echo-canceling circuit for performing offset calibration is shared with the receiving circuit of the communication system, no additional hardware cost is required.

Figure 2:
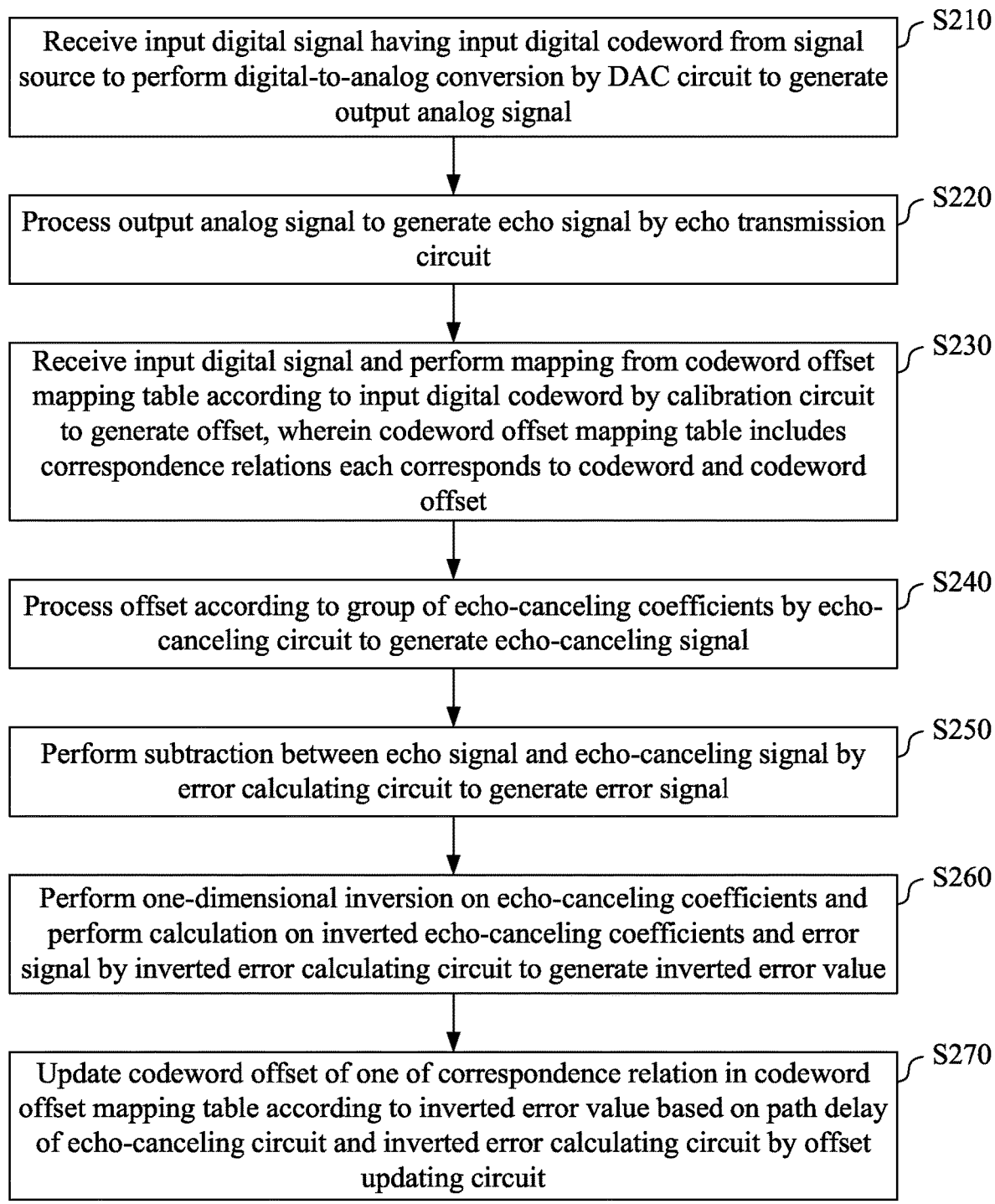
FIG. 2 illustrates a flow chart of a digital-to-analog conversion method having signal calibration mechanism according to an embodiment of the present invention.

Reference is now made to FIG. 2. FIG. 2 illustrates a flow chart of a digital-to-analog conversion method 200 having signal calibration mechanism according to an embodiment of the present invention.

In addition to the apparatus described above, the present disclosure further provides the digital-to-analog conversion method 200 that can be used in such as, but not limited to, the digital-to-analog conversion apparatus 100 in FIG. 1. As illustrated in FIG. 2, an embodiment of the digital-to-analog conversion method 200 includes the following steps.

In step S210, the input digital signal IS having the input digital codeword is received from the signal source SS to perform digital-to-analog conversion by the DAC circuit 110 to generate the output analog signal OAS In step S220, the output analog signal OAS is processed to generate the echo signal ES by the echo transmission circuit 120.

In step S230, the input digital signal IS is received and mapping is performed from the codeword offset mapping table TB according to the input digital codeword by the calibration circuit 130 to generate the offset DS, wherein the codeword offset mapping table TB includes a plurality of correspondence relations each corresponds to a codeword and a codeword offset.

In step S240, the offset DS is processed according to the group of echo-canceling coefficients CC by the echo-canceling circuit 140 to generate the echo-canceling signal ECS.

In step S250, subtraction is performed between the echo signal ES and the echo-canceling signal ECS by the error calculating circuit 150 to generate the error signal DIS.

In step S260, one-dimensional inversion is performed on the echo-canceling coefficients CC and calculation is further performed on the inverted echo-canceling coefficients and the error signal DIS by the inverted error calculating circuit 160 to generate the inverted error value FD.

In step S270, the codeword offset of one of the correspondence relation in the codeword offset mapping table TB is updated according to the inverted error value FD based on the path delay of the echo-canceling circuit 140 and the inverted error calculating circuit 160 by the offset updating circuit 170.

It is appreciated that the embodiments described above are merely an example. In other embodiments, it should be appreciated that many modifications and changes may be made by those of ordinary skill in the art without departing from the spirit of the disclosure.

In summary, the present invention discloses the digital-to-analog conversion apparatus and the digital-to-analog conversion method to perform calibration on the offset of each of different codewords to avoid the error caused by the offset of the output signal due to the offset of the codewords. Further, since the echo-canceling circuit for performing offset calibration is shared with the receiving circuit of the communication system, no additional hardware cost is required.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital-to-analog conversion (DAC) apparatus having signal calibration mechanism, comprising:
    a DAC circuit to receive an input digital signal having an input digital codeword from a signal source to perform digital-to-analog conversion to generate an output analog signal;
    an echo transmission circuit to process the output analog signal to generate an echo signal;
    a calibration circuit to receive the input digital signal and perform mapping from a codeword offset mapping table according to the input digital codeword to generate an offset signal, wherein the codeword offset mapping table comprises a plurality of correspondence relations each corresponds to a codeword and a codeword offset;

an echo-canceling circuit to process the offset according to a group of echo-canceling coefficients to generate an echo-canceling signal;

an error calculating circuit to perform subtraction between the echo signal and the echo-canceling signal to generate an error signal;

an inverted error calculating circuit to perform one-dimensional inversion on the echo-canceling coefficients and further perform calculation on the inverted echo-canceling coefficients and the error signal to generate an inverted error value; and an offset updating circuit to update the codeword offset of one of the correspondence relation in the codeword offset mapping table according to the inverted error value based on a path delay of the echo-canceling circuit and the inverted error calculating circuit.

2. The digital-to-analog conversion apparatus of claim 1, further comprising an auxiliary DAC circuit to receive the input digital signal and perform mapping from the codeword offset mapping table according to the input digital codeword to generate an offset calibration analog signal, such that the offset calibration analog signal and the output analog signal are added to cancel the codeword offset that the input digital codeword corresponds to, to generate an actual output analog signal.

3. The digital-to-analog conversion apparatus of claim 2, wherein the echo transmission circuit is further configured to process the actual output analog signal to generate the echo signal such that the offset updating circuit updates the codeword offset of one of the correspondence relation in the codeword offset mapping table accordingly.

4. The digital-to-analog conversion apparatus of claim 1, wherein before the offset updating circuit starts to update the codeword offset mapping table, the echo-canceling circuit is configured to perform a training process on the echo-canceling coefficients according to the error signal to make the echo-canceling coefficients converge.

5. The digital-to-analog conversion apparatus of claim 4, wherein the training process is a least mean square training process.

6. The digital-to-analog conversion apparatus of claim 1, wherein the inverted error calculating circuit is further configured to perform simplification on the echo-canceling coefficients according to a maximum energy distribution such that the echo-canceling coefficients only include two or less than two non-zero coefficients.

7. The digital-to-analog conversion apparatus of claim 1, wherein the echo transmission circuit comprises an echo response circuit and an analog-to-digital conversion circuit to perform an echo response processing and analog-to-digital conversion on the output analog signal respectively to generate the echo signal;

wherein the inverted error calculating circuit is further configured to control a sampling phase of the analog-to-digital conversion circuit to perform simplification on the echo-canceling coefficients such that the echo-canceling coefficients only include one non-zero coefficient.

8. A digital-to-analog conversion method having signal calibration mechanism, comprising:

receiving an input digital signal having an input digital codeword from a signal source by a DAC circuit to perform digital-to-analog conversion to generate an output analog signal;

processing the output analog signal by an echo transmission circuit to generate an echo signal;

receiving the input digital signal and performing mapping from a codeword offset mapping table according to the input digital codeword by a calibration circuit to generate an offset signal, wherein the codeword offset mapping table comprises a plurality of correspondence relations each corresponds to a codeword and a codeword offset;

processing the offset according to a group of echo-canceling coefficients by an echo-canceling circuit to generate an echo-canceling signal;

performing subtraction between the echo signal and the echo-canceling signal by an error calculating circuit to generate an error signal;

performing one-dimensional inversion on the echo-canceling coefficients and further performing calculation on the inverted echo-canceling coefficients and the error signal by an inverted error calculating circuit to generate an inverted error value; and updating the codeword offset of one of the correspondence relation in the codeword offset mapping table according to the inverted error value based on a path delay of the echo-canceling circuit and the inverted error calculating circuit by an offset updating circuit.

9. The digital-to-analog conversion method of claim 8, further comprising:

receiving the input digital signal and performing mapping from the codeword offset mapping table according to the input digital codeword by an auxiliary DAC circuit to generate an offset calibration analog signal, such that the offset calibration analog signal and the output analog signal are added to cancel the codeword offset that the input digital codeword corresponds to, to generate an actual output analog signal.

10. The digital-to-analog conversion method of claim 9, further comprising:

processing the actual output analog signal by the echo transmission circuit to generate the echo signal such that the offset updating circuit updates the codeword offset of one of the correspondence relation in the codeword offset mapping table accordingly.

11. The digital-to-analog conversion method of claim 9, further comprising:

before the offset updating circuit starts to update the codeword offset mapping table, performing a training process on the echo-canceling coefficients according to the error signal by the echo-canceling circuit to make the echo-canceling coefficients converge.

12. The digital-to-analog conversion method of claim 11, wherein the training process is a least mean square training process.

13. The digital-to-analog conversion method of claim 8, further comprising:

performing simplification on the echo-canceling coefficients according to a maximum energy distribution by the inverted error calculating circuit such that the echo-canceling coefficients only include two or less than two non-zero coefficients.

14. The digital-to-analog conversion method of claim 8, further comprising:

performing an echo response processing and analog-to-digital conversion on the output analog signal respectively by an echo response circuit and an analog-to-digital conversion circuit comprised by the echo transmission circuit to generate the echo signal; and controlling a sampling phase of the analog-to-digital conversion circuit to perform simplification on the echo-canceling coefficients by the inverted error calculating circuit such that the echo-canceling coefficients only include one non-zero coefficient.

* * * * *